United States Patent
Marton

Patent Number: 5,311,928
Date of Patent: May 17, 1994

[54] HEAT DISSIPATOR

[76] Inventor: Louis L. Marton, 401 Shirley Pl. No. 105, Beverly Hills, Calif. 90212

[21] Appl. No.: 83,940

[22] Filed: Jun. 28, 1993

[51] Int. Cl.$^5$ .............................................. F28F 7/00
[52] U.S. Cl. .................... 165/80.3; 165/185; 174/16.3; 257/722; 361/690; 361/703
[58] Field of Search ................ 165/185, 80.3; 174/16.3; 257/721, 722; 361/383, 386, 387

[56] References Cited

U.S. PATENT DOCUMENTS

| | | | |
|---|---|---|---|
| 3,187,812 | 6/1965 | Staver | 165/185 |
| 3,212,569 | 10/1965 | McAdam | 165/80.3 |
| 3,213,324 | 10/1965 | McAdam | 165/80.3 |
| 3,480,837 | 11/1969 | Feldmann | 165/80.3 |
| 4,588,028 | 5/1986 | Marshall et al. | 165/80.3 |
| 5,229,914 | 7/1993 | Bailey | 361/383 |

FOREIGN PATENT DOCUMENTS

| | | | |
|---|---|---|---|
| 1257412 | 2/1961 | France | 165/185 |
| 70162 | 3/1991 | Japan | 257/718 |
| 2199775 | 7/1988 | United Kingdom | 165/80.2 |

Primary Examiner—John Rivell
Assistant Examiner—L. R. Leo

[57] ABSTRACT

The high performance, high reliability compact heat dissipator is useful for cooling electronic components (3, 12, 25). It can be used on transfer surfaces (2, 13, 26) with various orientation for natural convection, or with a combination of natural convection and forced flow of the cooling medium. It consists of a highly heat conductive layer (1, 7, 11, 19 27 27C) with extensions (5A, 5B, 8A, 8B, 8A1, 8B1) having louver-like structures with fins (6, 9) for virtually boundary-layer free efficient heat transfer with a single layer (1, 11, 27), or with nested multiple layers (7, 19). It can be incorporated into the structure of a new component, or it can be attached to an existing component by heat conductive adhesive bonding (4).

12 Claims, 1 Drawing Sheet

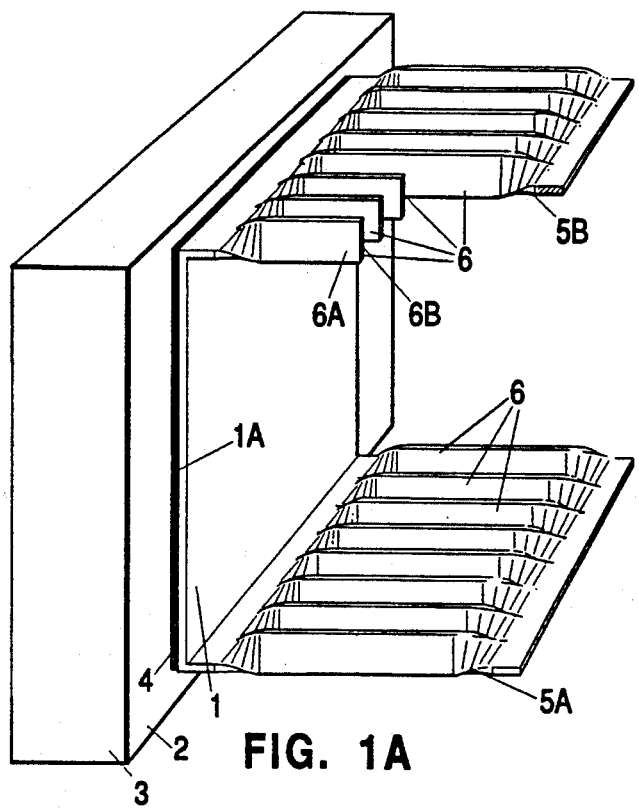
FIG. 1A
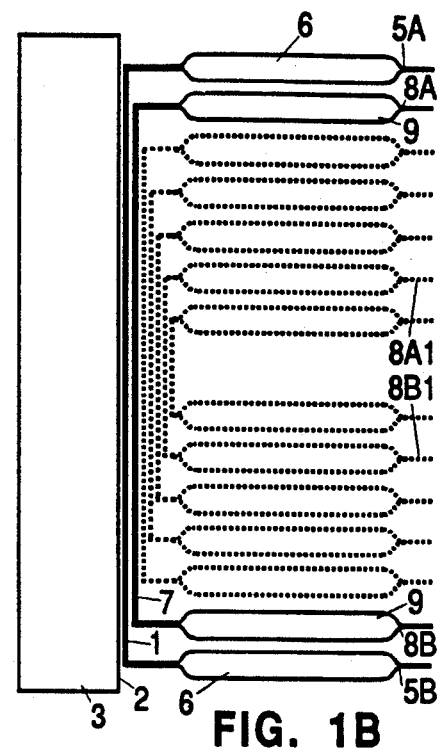
FIG. 1B
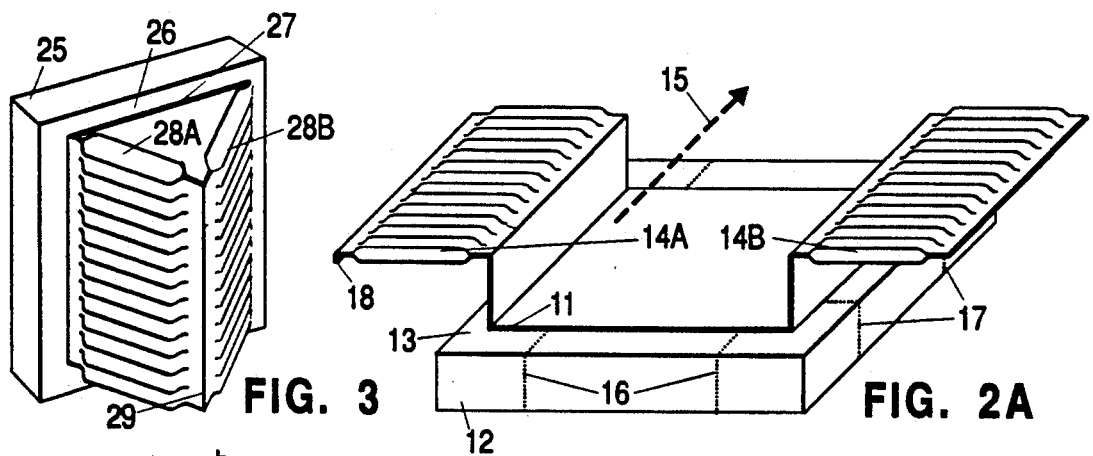
FIG. 3
FIG. 2A
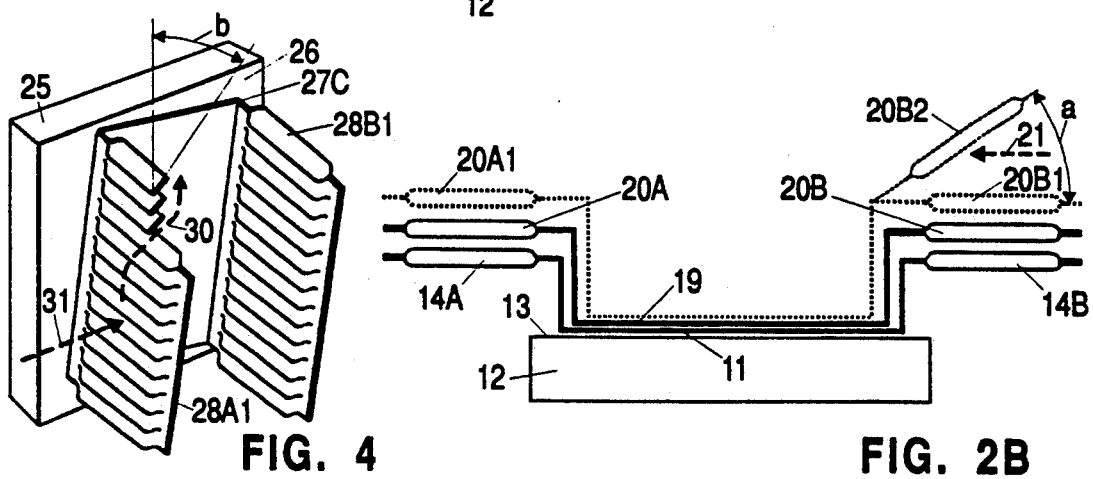
FIG. 4
FIG. 2B

HEAT DISSIPATOR

BACKGROUND

1. Field of Invention

This invention relates to improvements in heat dissipators to be used primarily with electronic components such as integrated circuits, power transistors, rectifiers, resistors, etc. operating in a gaseous or liquid cooling medium.

BACKGROUND

2. Description of Prior Art

A common characteristic of electronic components is that a certain loss of energy occurs in active parts during operation causing a temperature rise, which is the main and often the limiting factor as to the power handling capacity of the component. The temperature gradient in turn maintains a heat flow from the thermal center of the heat source toward the surfaces of the part where the heat gets dissipated partly by radiation, partly by natural convection or by the forced flow of the cooling medium.

In most cases the greatest resistance in the flow of the heat appears at the smooth unbroken surfaces between the solid material and the gaseous or liquid cooling medium; consequently, this is the place where the largest part of the temperature gradient develops. When the cooling medium warms up at the bottom edge of a smooth surface, the natural convection starts a flow vertically upward alongside the surface. As this flow progresses, however, a boundary-layer builds up on the surface with increasing thickness acting as an insulating layer and reducing the heat flow between the surface and the cooling medium flowing past.

Electronic components, especially solid state devices such as transistors, diodes, integrated circuits, disk drives, etc., if overheated, can be permanently damaged. In addition, their performance characteristics and reliability is influenced by their operating temperature. Most equipments are assembled with a large number of components arranged on circuit boards. The dimensions of these equipments are shrinking as more advanced components become available. Consequently, surfaces for heat transfer are reduced.

Thus most of these equipments apply cooling fans to move the air across these boards. The complexity and the operating frequency of the digital equipments is steadily increasing. This increase leads to increasing losses and higher temperature gradients. In addition, cooling fans may occasionally stop working. Thus the chances of serious permanent damage for expensive components are escalating.

A large number of heat dissipators has been developed for alleviating the danger of overheating. Most of them is designed as a base for these components, and they are often combined with fans. They cannot be applied to a completed equipment with limited dimensions which became overheated because of the recent introduction of accelerated operation.

OBJECTS AND ADVANTAGES

In view of the foregoing, several objects and advantages of the present invention are:

(a) to create a compact heat dissipator primarily for the use in convection cooling with extremely high heat transfer capacity per volume unit and small resistance in the flow path of the cooling medium; these features make possible a considerable extension of its applicability especially in circuit board assemblies; because of its compactness, the heat dissipator can be incorporated into the structure of a new component at the production process, or it can be installed later without difficulties when the need arises by attaching it to the heat transfer surface of the component with a layer of heat conductive adhesive bonding applied to the contact surface for providing permanent attachment.

(b) to reduce the portion of the resistance in the flow of the heat which appears at the surfaces of the components, and thus to reduce the temperature gradients appearing at the surfaces.

(c) to create a compact heat dissipator with extremely high heat transfer capacity to serve as emergency back up cooler in case of breakdown of the cooling fan operating in the system.

SUMMARY OF THE INVENTION

The invention achieves its objects by applying louver-like heat transfer surfaces between the heat dissipator and the cooling medium. On continuous undivided smooth surface used by most conventional heat dissipators, boundary-layer develops, increasing the resistance to the heat flow between the surface and the cooling medium. It is an experimentally established fact that at the leading edge of the surface, where the boundary-layer begins to form, it is of negligible thickness. If the surface of the dissipator is subdivided into a multiplicity of "leading edges" in accordance with the invention, the resulting louver-like structure remains virtually boundary-layer free, and the heat transfer will be substantially increased.

The same louver-like structure is used in several sizes for the production of strips of indeterminate length. The strips can be cut, bent, and assembled in accordance with the dimensional requirements of the different applications to build a large variety of heat dissipators for different heat transfer capacities. The dissipator can be incorporated in the structure of a new component at production. To apply it to an existing component, the contact surface of the assembled dissipator can be coated with a heat conductive adhesive layer for the purpose of establishing a heat conductive relationship and permanently connecting the dissipator to the transfer surface of the component simply be pressing it on.

Further essential features will become apparent on the basis of the following description. Various exemplary embodiments are illustrated in the accompanying drawings.

BRIEF DESCRIPTION OF THE DRAWINGS

FIG. 1A is a partial cutaway perspective view of a heat dissipator attached to the vertical heat transfer surface of a component;

FIG. 1B is a plan view of the same object shown in FIG. 1A with additional dissipators attached to the same transfer surface in nested configuration;

FIG. 2A is perspective view of a component with a heat dissipator attached to its horizontal transfer surface;

FIG. 2B is a plan view of the same object shown in FIG. 2A with additional heat dissipators attached to the same transfer surface in nested configuration;

FIG. 3 is a perspective view of a component with a heat dissipator attached to its vertical transfer surface FIG. 4 is partial cutaway perspective view of the same object shown in FIG. 3 with the two louver-like structures disposed perpendicular to the transfer surface of the component.

DESCRIPTION OF THE PREFERRED EMBODIMENTS

FIG. 1 is a partial cutaway perspective view of heat dissipator 1 in the form of a layer of highly heat conductive material having a contact surface 1A attached to heat transfer surface 2 of component 3 by bonding layer 4. Dissipator 1 includes two extended portions 5A, 5B extending beyond the top and bottom ends of its contact surface 1A and disposed in planes away from transfer surface 2 in a substantially perpendicular plane. Contact surface 1A is facing heat conductive adhesive bonding layer 4 applied to contact surface 1A providing permanent attachment of dissipator 1 to transfer surface 2. Both extended portions 5A, 5B are cut up into louver-like structures including a multiplicity of parallel fins 6. Fins 6 have two substantially parallel main surfaces 6A, 6B and two narrow surfaces at the leading edge and the trailing edge (with reference to the direction of the flow of the cooling medium). The longitudinal dimension of fins 6 defines an axis of orientation.

When component 3 produces heat, the heat is conducted to transfer surface 2 internally where after crossing bonding layer 4, dissipator 1 receives the heat and conducts it with negligible temperature gradient to extended portions 5A, 5B and to fins 6. The whole equipment is operating in a cooling medium. The cooling medium picks up heat along the surfaces, warms up and expands. The expanded medium rises vertically, and it generates the convection flow. Fins 6 are exposed to the flow of on both main surfaces and the two edge surfaces. In addition, a much larger volume of cooling medium is involved in the flow compared to the original transfer surface (2) of component 3, because of the larger cross section of the flow through the louver-like structure of extensions 5A, 5B. Therefore, this heat dissipator reduces not only the surface gradient, but also the temperature difference between incoming and outgoing medium. The outgoing medium of the lower structure, however, flows through the upper louver-like structure. If this outgoing medium is noticeably preheated, the upper louver-like structure can transfer proportionally less heat to the cooling medium, because it operates with reduced gradient. The effectiveness of the upper structure can be improved by using longer fins thus engaging more cooling medium in the process. Thus the temperature difference between incoming and outgoing flow will be smaller, and the flow received by the upper louver-like structure will be less preheated. Beside the available space, this circumstance is the decisive factor in determining the proper length of the fins.

The short travel of the heat across bonding layer 4 does not create noticeable temperature gradient because of the large size of the common contact surface (1A) offers a low resistance path to the heat flow. Negligible temperature gradient develops also along fins 6 due to the high heat conductivity of the heat dissipator material.

In a configuration shown in FIG. 1A, the cross section of the actively engaging flow of the cooling medium is about five times larger than the flow without the dissipator; surfaces of the louver-like structure are over twice as large as the original transfer surface (2) of component 3, because the cooling medium engages fins 6 on all sides. The gradient required for the same heat transfer per square centimeter on these louver-like structures compared to the original smooth transfer surface of component 3 is reduced at least by a factor of four due to the negligible boundary-layer; thus when using heat dissipator 1 as shown in FIG. 1A, the resistance to the heat flow, and the temperature gradient between the transfer surface of the component and the cooling medium is reduced at least by a factor of eight (twice for the larger active surfaces, and four times for the reduced boundary-layer). If it was a gradient of 100 degrees without heat dissipator, it is 12 degrees with heat dissipator. The drastic reduction of the surface gradient opens up the possibility of allowing operation generating increased losses and larger internal gradients. The component equipped with the heat dissipator can handle higher losses without overheating. This performance can be favorably compared to similar size conventional heat sinks built with smooth fins with motor driven blowers. Introducing a moving component, however, reduces the reliability and uses additional energy, beside the higher price.

If the internal gradient with a single heat dissipator 1 is smaller than the surface gradient, the further reduction of the surface gradient by applying additional heat dissipators 7 in nested configuration as shown in FIG. 1B is justifiable. Extensions 8A, 8B of dissipator 7 can be disposed in the position as shown; if there is a fan in the equipment adding a horizontal component to the flow of the cooling medium, shifting the louver-like structures of the nested dissipators apart (selecting one of the dotted positions, e.g., 8A1, 8B1) allows better access to fresh cooling medium for fins 9 due to the larger gaps between extended portions 5A and 8A1. For adapting the U-shaped basic dissipator hardware to this configuration, it can be split up into two L-shaped pieces with reduced contact portions.

FIG. 2A illustrates dissipator 11 attached to component 12 having horizontal transfer surface 13. Extensions 14A, 14B are disposed in a plane away from transfer surface 13 in substantially horizontal position and raised over the level of transfer surface 13 to allow an easier access for the flow of fresh cooling medium to louver-like structures 14A, 14B with natural convection. If a fan is working in the equipment creating horizontal flow 15 of the cooling medium, the U-shaped channel of dissipator 11 should be oriented parallel with this flow, as shown. To achieve this parallel orientation, dissipator 11 can be rotated on transfer surface 13 as needed. This orientation allows better access for the cooling medium to extensions 14A, 14B. The dissipator and the contacting transfer surface of the component may have deviating dimensions. E.g., if space permits it, the same dissipator 11 can be used on a narrower component having smaller width 16, or on a shorter one having length 17.

If the heat dissipator is exposed to handling, and there is a danger of deformation, part 18 of the outer edge of its extensions (e.g. 14A) can be bent as shown in FIG. 2A. This configuration provides increased rigidity for extension 14A.

Two layers 11, 19 can be accommodated with heat conductive bonding on transfer surface 13 in nested configuration, as illustrated in FIG. 2B. Extension 20A, 20B of layer 19 can follow the layout of extensions 14A, 14B if space is limited. If more space is available, improved heat transfer can be achieved be raising the extensions to positions 20A1, 20B1 to allow better access for fresh cooling medium. If horizontal flow component 21 is present due to fan operation, lifting extension 20B1 to position 20B2 offers improved engagement for the horizontal component of the cooling medium without seriously impairing natural convection in case of fan breakdown. Angular deviation a, however, between the axis of orientation of fin 20B2 and a horizontal reference plane should not be larger than 65 degrees; otherwise engagement with the cooling medium in natural convection, where the flow is substantially vertical, is more restricted, thus the heat transfer is noticeably reduced.

FIG. 3 shows component 25 with vertical transfer surface 26, and heat dissipator 27 attached to the transfer surface. Extensions 28A, 28B are connected at their outer edge 29 for achieving increased mechanical strength. This arrangement is useful on outside surfaces where accidental bending can occur.

FIG. 4 shows the same arrangement shown in FIG. 3, except extensions 28A1, 28B1 are perpendicularly arranged to transfer surface 26, and dissipator 27C is slightly rotated clockwise to offer less resistance for horizontal forced flow 31. This deviating orientation is useful when strong horizontal flow 31 is generated by a fan in the equipment, but it is desirable to have a good heat transfer when the fan is not in operation. To achieve best overall performance with a diagonal forced flow, the dissipator can be rotated on the contact surface for better engagement with the flow. There is a limitation, however. To preserve a reasonably good heat transfer with natural convection 30, it is necessary to keep angular deviation b between the main surface of the fins of extension 28A1, 28B1 and a vertical reference plane less than 85 degree; otherwise the convection flow 30 cannot start up through the louver-like structures.

If no forced flow of the cooling medium is expected, it is advantageous in every arrangement to keep angle b as close to zero as practically possible to reduce the resistance in the path of the flow in natural convection. Turning the main surfaces of the fins to vertical direction, the resistance in the flow path of the cooling medium in natural convection is minimum. Consequently, the heat transfer between the louver-like structure and the cooling medium is optimum.

SUMMARY, RAMIFICATIONS, AND SCOPE

The described heat dissipators offer low cost, high performance cooling for maintaining low operating temperatures on electronic components with unsurpassed reliability, and no additional energy consumption. As the technology develops, operating frequencies are rising creating thermal overload on the shrinking components. This trend leads to reduced reliability and shorter life expectancy. The application of the described affordable heat dissipators reverses this trend and assure an extended life expectancy with the highest reliability.

The foregoing specification has set forth specific structures in detail for the purpose of illustrating the invention. It will be understood that such details of structure may be varied widely without departure from the scope and spirit of the invention as defined in the specification and in the following claims.

What is claimed is:

1. A heat dissipator for electronic component means of the type having at least one heat transfer surface exposed to a flow of gaseous or liquid cooling medium, said dissipator comprising:
    at least one layer of highly heat conductive material having a contact surface in heat conductive relationship with and connected to at least one of said transfer surfaces for receiving heat from said component means,
    said layer including at least one extension means extending beyond said contact surface disposed in a first plane away from said transfer surface and comprising a louver-like structure for transferring heat between said contact surface and said cooling medium,
    said louver-like structure comprising a multiplicity of substantially parallel fin means defining an axis of orientation parallel to their longitudinal dimension and a central axis for each fin means extending through the center of each, substantially parallel to said axis of orientation,
    said fin means created by subdividing at least one portion of said extension means along substantially parallel lines and by rotating each of said fin means on its central axis into an angular deviation of less than 90 degrees with reference to said first plane, said fin means having two substantially parallel main surfaces on opposed sides, two edge surfaces at a leading and a trailing edge with reference to the flow of said cooling medium, the distance between central axes of adjacent fin means being equal to a width of the main surface of said fin means, the rotation of said fin means opening up gaps in said louver-like structure between main surfaces of adjacent fin means to allow better access to fresh cooling medium flowing through said gaps and exposing said fins means to said flow on both of their main surfaces and at least one edge surface, to increase the engagement of said fin means with said cooling medium for achieving optimum heat transfer between said fin means and said cooling medium.

2. A heat dissipator for electronic component means according to claim 1, wherein said extension means has an outer edge for providing rigidity whereby the heat dissipator can be exposed to handling without the danger of deformation of said louver-like structure.

3. A heat dissipator for electronic component means according to claim 2, wherein an end strip portion along said outer edge of at least one of said extension means is bent out of said first plane to increase the mechanical strength of said extension.

4. A heat dissipator for electronic component means according to claim 1, wherein the dimension of said gap between said main surfaces of two neighboring fin means is at least twice the layer thickness of said fin means.

5. A heat dissipator for electronic component means according to claim 1 wherein said first plane is substantially perpendicular to one of said transfer surfaces.

6. A heat dissipator for electronic component means according to claim 1 wherein said first plane is substantially parallel to one of said transfer surfaces.

7. A heat dissipator for electronic component means according to claim 1 wherein said first plane is disposed at an angular deviation not larger than 85 degrees with reference to a horizontal plane.

8. A heat dissipator for electronic component means according to claim 1, further including at least two of said layers, each having said extension means comprising said louver-like structures, said layers being accommodated on one of said transfer surfaces in nested configuration.

9. A heat dissipator for electronic component means according to claim 1 wherein said layer and the contacting transfer surface have at least one deviating dimension.

10. A heat dissipator for electronic component means according to claim 1, further including a layer of heat conductive adhesive bonding means applied between at least one of said transfer surfaces and said contact surfaces for providing heat conductive relationship and permanent attachment of said heat dissipator to said transfer surface.

11. A heat dissipator for electronic component means according to claim 1, wherein said outer edges of two extensions are connected for increasing the mechanical strength of said structure.

12. A heat dissipator for electronic component means according to claim 1, wherein said dissipator is positioned on said transfer surface of said component with an angular deviation with reference to said component for improved engagement with a forced flow of said cooling medium.

* * * * *